(12) United States Patent
Curran et al.

(10) Patent No.: US 11,352,708 B2
(45) Date of Patent: Jun. 7, 2022

(54) COLORED MULTILAYER OXIDE COATINGS

(71) Applicant: Apple Inc., Cupertino, CA (US)

(72) Inventors: James A. Curran, Morgan Hill, CA (US); Karin H. Rasmussen, Cupertino, CA (US); Zechariah D. Feinberg, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 348 days.

(21) Appl. No.: 15/233,728

(22) Filed: Aug. 10, 2016

(65) Prior Publication Data

US 2018/0049337 A1    Feb. 15, 2018

(51) Int. Cl.

| | |
|---|---|
| *C23C 14/10* | (2006.01) |
| *C25D 11/24* | (2006.01) |
| *H05K 5/04* | (2006.01) |
| *C25D 11/14* | (2006.01) |
| *C25D 11/26* | (2006.01) |
| *C25D 11/30* | (2006.01) |
| *C25D 11/22* | (2006.01) |
| *B32B 15/04* | (2006.01) |

(Continued)

(52) U.S. Cl.
CPC ............ *C25D 11/243* (2013.01); *B32B 15/04* (2013.01); *C25D 11/14* (2013.01); *C25D 11/22* (2013.01); *C25D 11/24* (2013.01); *C25D 11/246* (2013.01); *C25D 11/26* (2013.01); *C25D 11/30* (2013.01); *H05K 5/04* (2013.01); *C25D 11/04* (2013.01); *C25D 11/08* (2013.01)

(58) Field of Classification Search
CPC ..................... C25D 11/243; C25D 11/04–246; H05K 5/04; B32B 3/26; B32B 3/30

USPC ......................................................... 205/153
See application file for complete search history.

(56) References Cited

U.S. PATENT DOCUMENTS

| | | | |
|---|---|---|---|
| 2,692,851 A | 10/1954 | Burrows | |
| 3,216,866 A * | 11/1965 | Orlin ................... | C25D 11/243 427/273 |

(Continued)

FOREIGN PATENT DOCUMENTS

| | | |
|---|---|---|
| CH | 691064 A5 | 4/2001 |
| CN | 1254028 A | 5/2000 |

(Continued)

OTHER PUBLICATIONS

International Search Report and Written Opinion for PCT Application No. PCT/US2015/025000 dated Jan. 26, 2016.

(Continued)

*Primary Examiner* — Lee E Sanderson
*Assistant Examiner* — Michael C Romanowski
(74) *Attorney, Agent, or Firm* — Dorsey & Whitney LLP

(57) ABSTRACT

Colored oxide coatings having multiple oxide layers are described. Processes for forming the multilayer oxide coating can include converting a portion of a metal substrate to a primary oxide layer, coloring the primary oxide layer, and depositing a secondary oxide layer on the primary oxide layer. The primary oxide layer and the secondary oxide layer can be at least partially transparent such that a texture of an underlying metal substrate surface is visible through the multilayer oxide coating. A top surface of the secondary oxide layer can be polished to a high gloss to give the multilayer oxide coating an appearance of depth.

9 Claims, 9 Drawing Sheets

(51) Int. Cl.
*C25D 11/08* (2006.01)
*C25D 11/04* (2006.01)

(56) References Cited

U.S. PATENT DOCUMENTS

| | | | |
|---|---|---|---|
| 3,388,050 A | 6/1968 | Wainer et al. | |
| 3,411,994 A | 11/1968 | Wainer et al. | |
| 3,723,258 A * | 3/1973 | Podell et al. | C25D 11/04 |
| | | | 148/DIG. 118 |
| 3,985,629 A | 10/1976 | Kimura | |
| 4,039,355 A | 8/1977 | Takahashi et al. | |
| 4,066,516 A | 1/1978 | Sato | |
| 4,111,762 A * | 9/1978 | Wade | C25D 11/08 |
| | | | 205/208 |
| 4,189,360 A | 2/1980 | Woods et al. | |
| 4,483,751 A | 11/1984 | Murayama et al. | |
| 4,518,468 A | 5/1985 | Fotland et al. | |
| 4,589,972 A * | 5/1986 | Pompea | F24S 70/225 |
| | | | 205/205 |
| 4,606,796 A * | 8/1986 | Hanazima | C25D 11/18 |
| | | | 205/174 |
| 4,631,112 A | 12/1986 | Usui et al. | |
| 4,856,326 A | 8/1989 | Tsukamoto | |
| 4,894,127 A | 1/1990 | Wong et al. | |
| 4,987,766 A | 1/1991 | Brar et al. | |
| 5,066,368 A | 11/1991 | Pasqualoni et al. | |
| 5,078,845 A | 1/1992 | Kunugihara et al. | |
| 5,132,003 A * | 7/1992 | Mitani | C25D 11/22 |
| | | | 205/173 |
| 5,277,788 A | 1/1994 | Nitowski et al. | |
| 5,336,341 A | 8/1994 | Maejima et al. | |
| 5,472,788 A | 12/1995 | Benitez-Garriga | |
| 5,705,225 A | 1/1998 | Dornfest et al. | |
| 5,904,989 A * | 5/1999 | Hanggi | C25D 11/04 |
| | | | 428/457 |
| 5,919,561 A | 7/1999 | Fuchs et al. | |
| 6,027,629 A | 2/2000 | Hisamoto et al. | |
| 6,235,409 B1 | 5/2001 | Serafin et al. | |
| 6,339,958 B1 | 1/2002 | Tsui et al. | |
| 6,368,483 B1 * | 4/2002 | Ball | C25D 11/04 |
| | | | 205/106 |
| 6,581,446 B1 | 6/2003 | Deneuville et al. | |
| 7,166,205 B2 | 1/2007 | Kuo et al. | |
| 7,527,872 B2 | 5/2009 | Steele et al. | |
| 7,732,056 B2 | 6/2010 | Bhatnagar et al. | |
| 7,820,300 B2 | 10/2010 | Dolan | |
| 8,016,948 B2 | 9/2011 | Wang et al. | |
| 8,145,411 B2 | 3/2012 | Watanabe et al. | |
| 8,309,237 B2 | 11/2012 | Levendusky et al. | |
| 8,318,256 B2 | 11/2012 | Ishii et al. | |
| 8,535,505 B2 | 9/2013 | Yi et al. | |
| 8,691,403 B2 | 4/2014 | Amakusa et al. | |
| 8,950,465 B2 | 2/2015 | Lin et al. | |
| 8,962,163 B2 | 2/2015 | Shimao et al. | |
| 8,968,548 B2 | 3/2015 | Lai et al. | |
| 9,133,559 B2 | 9/2015 | Silverman et al. | |
| 9,312,511 B2 | 4/2016 | Mandlik et al. | |
| 9,349,536 B2 | 5/2016 | Lee et al. | |
| 9,359,686 B1 | 6/2016 | Curran et al. | |
| 9,512,510 B2 | 12/2016 | Hatta | |
| 9,669,604 B2 | 6/2017 | Tatsumi et al. | |
| 9,869,623 B2 | 1/2018 | Hamann et al. | |
| 2003/0196907 A1 | 10/2003 | Viola | |
| 2004/0004003 A1 | 1/2004 | Hesse | |
| 2004/0129574 A1 | 7/2004 | Kia et al. | |
| 2005/0061680 A1 | 3/2005 | Dolan | |
| 2005/0106403 A1 | 5/2005 | Yui | |
| 2006/0019035 A1 | 1/2006 | Munz et al. | |
| 2006/0086475 A1 | 4/2006 | Miyashita et al. | |
| 2006/0108030 A1 | 5/2006 | Yoshioka et al. | |
| 2006/0204780 A1 | 9/2006 | Vega et al. | |
| 2007/0000583 A1 | 1/2007 | Rioja et al. | |
| 2008/0274375 A1 | 11/2008 | Ng et al. | |
| 2008/0283408 A1 | 11/2008 | Nishizawa | |
| 2009/0041988 A1 * | 2/2009 | Ho | C25D 11/04 |
| | | | 428/172 |
| 2009/0050485 A1 | 2/2009 | Wada et al. | |
| 2009/0152120 A1 | 6/2009 | Cao et al. | |
| 2009/0233113 A1 | 9/2009 | Hisamoto et al. | |
| 2010/0024534 A1 | 2/2010 | Li et al. | |
| 2010/0264036 A1 | 10/2010 | Hatanaka et al. | |
| 2010/0326839 A1 | 12/2010 | Morikawa et al. | |
| 2011/0252874 A1 | 10/2011 | Patten et al. | |
| 2011/0284383 A1 | 11/2011 | Cabot et al. | |
| 2011/0297319 A1 | 12/2011 | Chen et al. | |
| 2012/0000783 A1 | 1/2012 | Suda et al. | |
| 2012/0103819 A1 | 5/2012 | Chang et al. | |
| 2012/0298513 A1 | 11/2012 | Shimao et al. | |
| 2013/0008796 A1 | 1/2013 | Silverman et al. | |
| 2013/0029094 A1 * | 1/2013 | Chang | B32B 9/04 |
| | | | 428/141 |
| 2013/0075262 A1 | 3/2013 | Teng | |
| 2013/0081952 A1 * | 4/2013 | Akimoto | C25D 11/243 |
| | | | 205/50 |
| 2013/0153427 A1 * | 6/2013 | Tatebe | C25D 5/18 |
| | | | 205/50 |
| 2013/0156635 A1 | 6/2013 | Lee et al. | |
| 2013/0302641 A1 | 11/2013 | Zhang et al. | |
| 2013/0319866 A1 | 12/2013 | Browning et al. | |
| 2013/0319868 A1 | 12/2013 | Yoshida et al. | |
| 2013/0319872 A1 | 12/2013 | Woodhull et al. | |
| 2014/0061054 A1 | 3/2014 | Ye | |
| 2014/0083861 A1 | 3/2014 | Askin et al. | |
| 2014/0166490 A1 * | 6/2014 | Tatebe | C25D 5/02 |
| | | | 205/50 |
| 2014/0190739 A1 * | 7/2014 | Zhou | H05K 5/04 |
| | | | 174/565 |
| 2014/0262790 A1 | 9/2014 | Levendusky et al. | |
| 2015/0029414 A1 | 1/2015 | Hur et al. | |
| 2015/0090373 A1 * | 4/2015 | Gable | C22F 1/053 |
| | | | 148/549 |
| 2015/0132541 A1 | 5/2015 | McDonald et al. | |
| 2015/0368515 A1 | 12/2015 | Lu et al. | |
| 2016/0060783 A1 | 3/2016 | Curran et al. | |
| 2016/0237586 A1 | 8/2016 | Curran et al. | |
| 2016/0289858 A1 | 10/2016 | Curran et al. | |
| 2016/0290917 A1 | 10/2016 | Hamann et al. | |
| 2016/0312374 A1 | 10/2016 | Duffy et al. | |
| 2017/0051425 A1 | 2/2017 | Curran et al. | |
| 2017/0051426 A1 | 2/2017 | Curran et al. | |
| 2017/0088917 A1 | 3/2017 | Curran et al. | |
| 2017/0121837 A1 | 5/2017 | Tatebe et al. | |
| 2017/0292202 A1 | 10/2017 | Curran et al. | |
| 2018/0237936 A1 | 8/2018 | Curran et al. | |
| 2019/0037721 A1 | 1/2019 | Curran et al. | |

FOREIGN PATENT DOCUMENTS

| | | |
|---|---|---|
| CN | 1616709 A | 5/2005 |
| CN | 1632178 A | 6/2005 |
| CN | 1774158 A | 5/2006 |
| CN | 1965618 A | 5/2007 |
| CN | 101048277 A | 10/2007 |
| CN | 101287861 A | 10/2008 |
| CN | 101298690 A | 11/2008 |
| CN | 101325849 A | 12/2008 |
| CN | 101970723 A | 2/2011 |
| CN | 102333897 A | 1/2012 |
| CN | 102654782 A | 9/2012 |
| CN | 102666894 A | 9/2012 |
| CN | 103484737 A | 1/2014 |
| CN | 103484916 A | 1/2014 |
| CN | 103526088 A | 1/2014 |
| CN | 103732772 A | 4/2014 |
| CN | 103930600 A | 7/2014 |
| CN | 103938250 A | 7/2014 |
| CN | 104762538 A | 7/2015 |
| CN | 108531958 A | 9/2018 |
| EP | 997545 A1 | 5/2000 |
| EP | 1397244 B1 | 12/2009 |
| EP | 2301760 A2 | 3/2011 |
| EP | 1688020 B1 | 4/2013 |

(56) References Cited

FOREIGN PATENT DOCUMENTS

| | | |
|---|---|---|
| EP | 2817948 A1 | 12/2014 |
| JP | S4925538 B1 | 7/1974 |
| JP | H0347937 A | 2/1991 |
| JP | 2000313996 A | 11/2000 |
| JP | 2009209426 A | 9/2009 |
| JP | 2009209726 A | 9/2009 |
| KR | 20120021616 A | 3/2012 |
| KR | 101235350 B1 | 2/2013 |
| WO | 2010099258 A1 | 9/2010 |
| WO | 2013123770 A1 | 8/2013 |
| WO | 2013192579 A1 | 12/2013 |
| WO | 2014045886 A1 | 3/2014 |
| WO | 2014149194 A1 | 9/2014 |
| WO | 2015199639 A1 | 12/2015 |
| WO | 2018121212 A1 | 7/2018 |

OTHER PUBLICATIONS

Garcia-Vergara, S. et al; "Morphology of enriched alloy layers in an anodized Al—Cu alloy" Applied Surface Science, 205 (2003),p. 121-127.
Alwitt, RS. and RC. McClung , "Mechanical Properties of Anodized Aluminum Coatings"; Proceedings of the SUR/FIN7 92, American Electroplaters and Surface Finishers Society, Atlanta, Georgia, Jun. 1992.
Yann Goueffon et al., "Study of Degradation Mechanisms of Black Anodic Films in Simulated Space Environment" URL:http://webcache.googleusercontenl.com/search?q=cache:fsJq5LjVTVIJ:esmal.esa.inl/materials_news/isme09/of/6Contamination/S8%2520%2520Goueffon.pdf+&cd=1&hl=en&ct=clnk&gl=us.
Henkel Corporation "Bonderite M-ED 9000 Anodizing Seal (Known as Anoseal 9000)" Technical Process Bulletin Issued Jun. 10, 2013.
Hao et al., "Sealing Processes of Anodic Coatings—Past, Present, and Future", Metal Finishing, vol. 98, Issue 12, Dec. 2000, p. 8-18.
International Search Report & Written Opinion for PCT Application No. PCT/US2015/010736 dated Oct. 29, 2015.
International Search Report & Written Opinion for PCT Application No. PCT/US2015/024349 dated Dec. 17, 2015.
International Search Report & Written Opinion for PCT Application No. PCT/US2014/053595 dated Jun. 24, 2015.
Habazaki et al., "Nanoscale Enrichments of Substrate Elements in the Growth of Thin Oxide Films", Corrosion Science, vol. 39, No. 4, pp. 731-737, 1997.
Vesborg et al., "Addressing the terawatt challenge: scalability in the supply of chemical elements for renewable energy," RSC Advances, 2, pp. 7933-7947, 2012.
European Patent Application No. 16150283.6—European Search Report dated Jun. 9, 2016.
International Patent Application No. PCT/US2016/043256—International Search Report and Written Opinion dated Oct. 12, 2016.
Diggle et al., Incorporation of anions: "Anodic oxide films on aluminum", Chemical Reviews, vol. 69, pp. 365-405 (1969 ), (41 Pages).
Charles Grubbs, "Anodizing of Aluminium", Metalfinishing, pp. 397-412, (16 Pages).
Milton Stevenson, "Anodizing", ASM Handbook vol. 5 (1994), 12 Pages.
Wang et al., "Brilliant and tunable color of carbon-coated thin anodic aluminum oxide films", Appl. Phys. Lett., 91, 2007, 4 Pages.
Brock, et al., "European Coatings Handbook", 2000, Curt R. Vincentz, (pp. 374-376), 5 Pages.
Taiwanese Patent Application No. 105125817—Office Action and Search Report dated Apr. 19, 2017.
Achbach et.al. WADC technical report 55-150, Part VI, Project No. 7360, 1957.
Chinese Application for Invention No. 201610011395.4—First Office Action dated Jul. 21, 2017.
Saenz de Miera et al. Surface and Interface Analysis, 2012 242, 241-246.
John C. Ion. Laser Processing of Engineering Materials. Elsevier, 2005 p. 160.
Chinese Application for Invention No. 201610202013.6—First Office Action dated Sep. 15, 2017.
Chinese Application for Utility Model No. 201490001542.4—First Office Action dated Sep. 27, 2017.
European Patent Application No. 16150283.6—Office Action dated Jan. 18, 2018.
Chinese Application for Utility Model No. 201490001542.4—Second Office Action dated Feb. 1, 2018.
Chinese Patent Application No. 201610011395.4—Second Office Action dated on Feb. 14, 2018.
Guo Jialin etc., "Analysis of Effect on Hot Crackability of 6060 Alloy Oxide Film", Materials Research and Application, vol. 5, No. 3, p. 229-232.
Chinese Application for Invention No. 201610202013.6—Second Office Action dated Apr. 11, 2018.
Chinese Patent Application No. 201610011395.4—Third Office Action dated Aug. 15, 2018.
Habazaki, H. et al. Effects of Alloying Elements in Anodizing of Aluminium. Trans IMF, 1997, 75(1), 18-23. (Year: 1997), 6 pages.
The Aluminum Association, Inc. International Alloy Designations and Chemical Composition Limits for Wrought Aluminum and Wrought Aluminum Alloys. Jan. 2015. (Year: 2015), 38 pages.
Chinese Application for Invention No. 201610202013.6—Third Office Action dated Dec. 24, 2018.
Chinese Patent for Utility Model No. ZL201490001542.4—Utility Model Patent Evaluation Report (UMPER) dated Jan. 7, 2019.
Chinese Patent Application No. 201680050544.6—First Office Action dated Jan. 30, 2019.
Chinese Application for Invention No. 201610011395.4—Fourth Office Action dated Feb. 25, 2019.
Chinese Patent Application No. 201680050544.6—Second Office Action dated Sep. 27, 2019.

\* cited by examiner

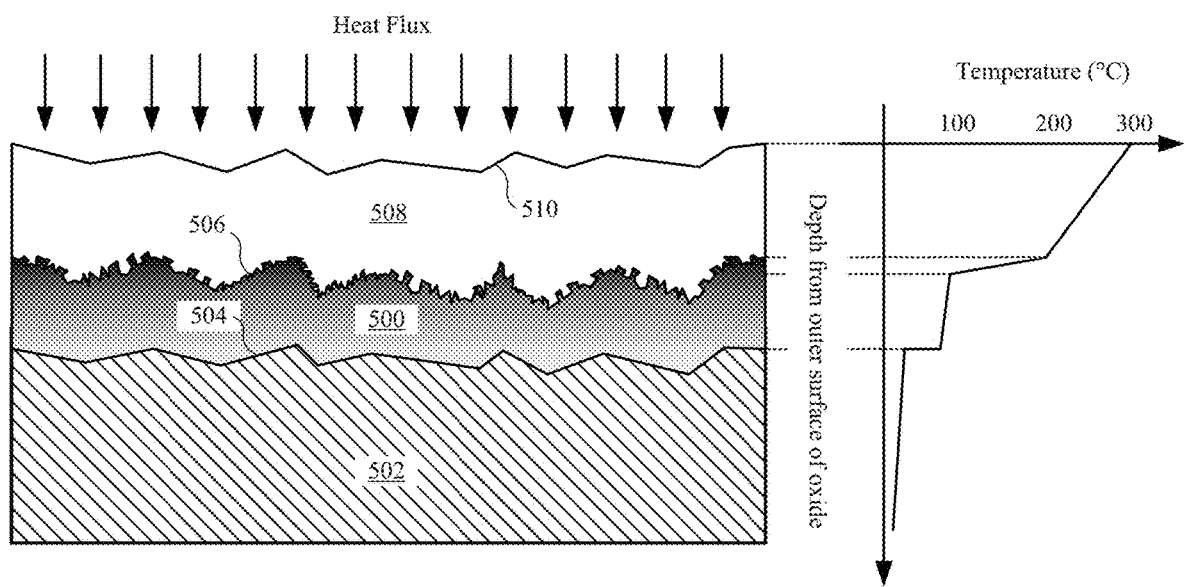
*FIG. 5A*   *FIG. 5B*

COLORED MULTILAYER OXIDE COATINGS

FIELD

The described embodiments relate to multilayer oxide coatings and methods of forming the same. The multilayer oxide coatings have structural features that can enhance or preserve colors of the multilayer oxide coatings.

BACKGROUND

Anodizing offers an attractive and versatile surface finish for aluminum parts. The anodic oxide formed by anodizing in sulfuric acid, for example, can be relatively transparent, and colorless, giving a bright, silver metallic finish that looks like bare metal, while improving wear and corrosion resistance due to the thick, and relatively hard protective coating for aluminum surfaces. Alternatively, the anodic oxide can be colored to achieve a wide range of colors, whilst still offering a durable and corrosion resistance surface finish for aluminum.

Coloring of the anodic oxides may be achieved in many ways, including alloying of the substrate metal, anodizing in electrolytes which comprise organic acids, and the deposition of metal or other fine-scale pigments within the pore structure of the anodic oxide. One of the most flexible and widely used coloring processes is dyeing the oxide with organic dyes prior to sealing the pore structure. However, the concentration of adsorbed dye is generally not uniform throughout the oxide thickness in that it can be greatest near the outer surface of the oxide and rapidly diminish with depth from the outer surface. Thus, any abrasion of the outer surface of the anodic oxide can also diminish the color of the anodic oxide. What are needed therefore are oxide coatings that can retain coloring when subject to abrasion or other removal processes.

SUMMARY

This paper describes various embodiments that relate to multilayer oxide coatings and processes for forming the same. The multilayer oxide coatings can have an outer oxide layer that can be subjected to a finishing operation to provide a cosmetically appealing finished surface, while protecting an inner oxide layer from the finishing operation.

According to one embodiment, an enclosure for an electronic device is described. The enclosure includes a metal substrate having a multilayer oxide coating. The multilayer oxide coating includes a primary oxide layer on the metal substrate. The primary oxide layer is characterized as having a color. The multilayer oxide coating also includes a secondary oxide layer on the primary oxide layer. The secondary oxide layer is composed of a different oxide than the primary oxide layer and is sufficiently transparent that the color of the primary oxide layer is visible through the secondary oxide layer.

According to another embodiment, an enclosure for an electronic device is described. The enclosure includes an aluminum alloy substrate having a coating. The coating includes an aluminum oxide layer on the aluminum alloy substrate. The aluminum oxide layer has a colorant infused within pores of the aluminum oxide layer. The coating also includes a silicon oxide layer on the aluminum oxide layer. The silicon oxide layer is sufficiently transparent that the colorant within the aluminum oxide layer is visible through the silicon oxide layer.

According to a further embodiment, a method of forming a multilayer coating on an enclosure of an electronic device is described. The method includes converting a portion of a metal substrate to a primary oxide layer. The method also includes depositing a colorant within pores of the primary oxide layer. The method further includes depositing a secondary oxide layer on the primary oxide layer.

These and other embodiments will be described in detail below.

BRIEF DESCRIPTION OF THE DRAWINGS

The disclosure will be readily understood by the following detailed description in conjunction with the accompanying drawings, wherein like reference numerals designate like structural elements.

FIGS. 5A-5C show alternative structures of a multilayer oxide coating to protect integrity of a dye during a thermal curing operation.

DETAILED DESCRIPTION

Figure 1:
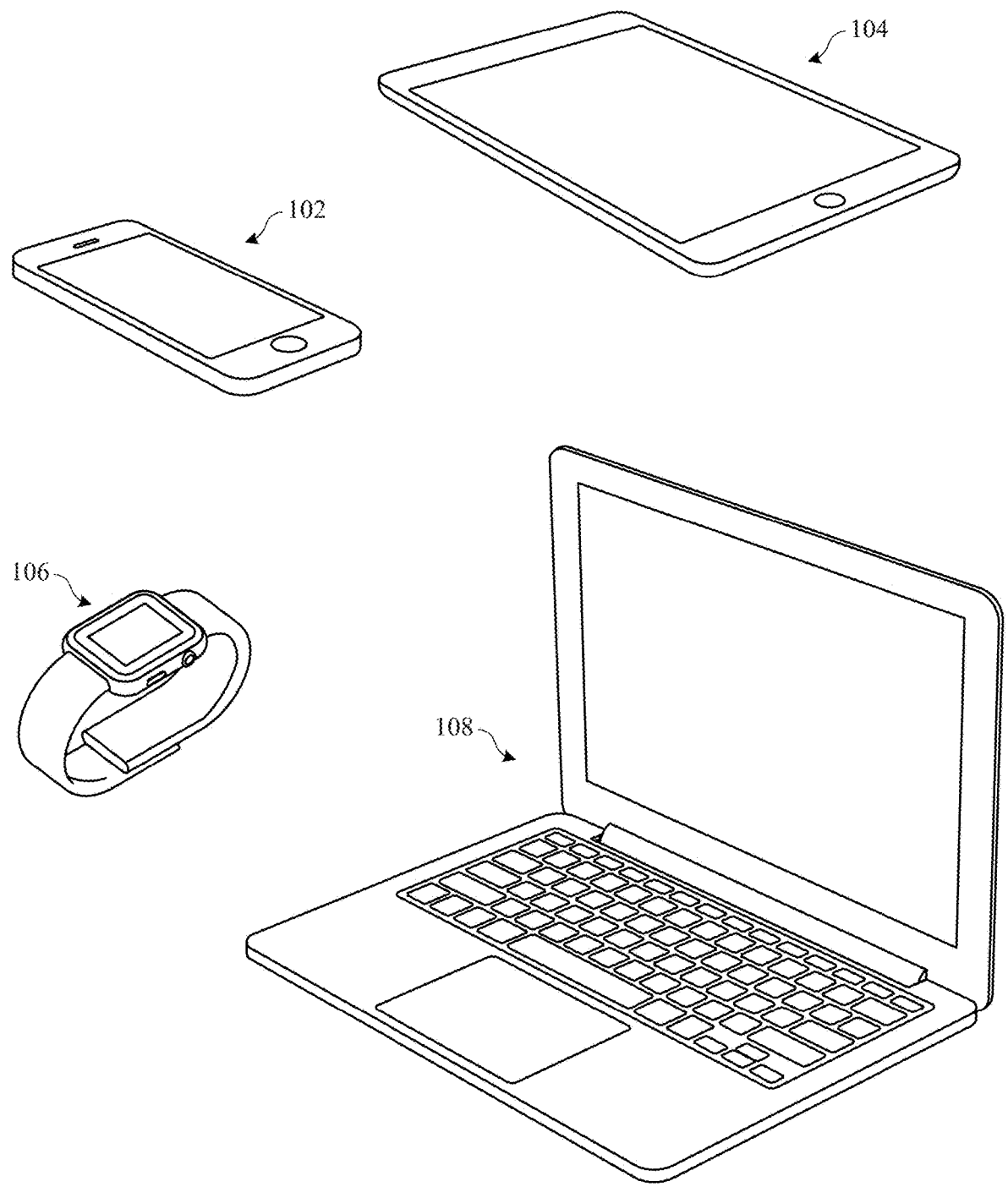
FIG. 1 shows perspective views of devices having metal surfaces that can be treated using processes described herein.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Multilayer oxide coatings and methods of forming the same are described. In some cases, the multilayer oxide coatings have infused colorants that impart colors to the multilayer oxide coatings. Various structures of the multilayer oxide coatings can enhance the colors and can provide a more uniform coloring to the coatings. For example, the multilayer oxide coatings can include a primary oxide layer that has a porous microstructure, thereby providing a medium for incorporating one or more colorants therein, and a secondary layer that protect the primary oxide layer from abrasion. In some embodiments, the secondary layer is composed of an oxide material. In some cases the secondary layer is sufficiently transparent that a color of the primary oxide layer is visible through the secondary layer. The primary oxide layer may also be at least partially transparent such that a surface texture of the metal substrate is visible through the multilayer coating. Structural qualities of the oxide layers within the multilayer oxide layers, such as thicknesses and type of oxide material, can be selected to enhance particular aspects, such as color preservation, hardness, and scratch resistance.

In some embodiments, a multilayer oxide coating is formed using at least one anodizing process and at least one oxide deposition process. For example, an anodizing process can convert a surface portion of a metal substrate to a primary oxide layer. A deposition process can then be used to deposit a secondary layer on the primary oxide layer. In some cases a coloring process is used to colorize the primary oxide layer. The coloring process can involve an infusion process whereby a colorant, such as an organic dye, metal colorant, or both, are infused within pores of the primary oxide layer. In some cases, the secondary layer is finished using, for example a polishing or buffing process, to create a smooth and shiny outer surface to the multilayer coating. In this way, the secondary layer can shield the primary oxide layer from erosion via the finishing process, as well as any colorant infused therein, thereby preserving a color of the primary oxide layer.

Methods described herein are well suited for providing cosmetically appealing surface finishes to consumer products. For example, the methods described herein can be used to form durable and cosmetically appealing finishes for housings for computers, portable electronic devices, wearable electronic devices, and electronic device accessories, such as those manufactured by Apple Inc. based in Cupertino, Calif. As used herein, the terms oxide, oxide coating, oxide film, oxide layer, etc. can be used interchangeably and can refer to suitable oxide material, unless otherwise specified.

These and other embodiments are discussed below with reference to FIGS. 1-6. However, those skilled in the art will readily appreciate that the detailed description given herein with respect to these Figures is for explanatory purposes only and should not be construed as limiting.

FIG. 1 shows consumer products than include multilayer oxide coatings described herein. FIG. 1 includes portable phone 102, tablet computer 104, smart watch 106 and portable computer 108, each of which can include enclosures that are made of metal or have metal sections. Aluminum alloys are often a choice metal material due to their light weight, durability and ability to be anodized—however other metal alloys may also be used. The multilayer coatings described herein can include an anodic oxide layer that has pores formed during the anodizing process and which can be infused with colorants to impart a desired color to the coating. The multilayer coatings can also include an outer oxide layer that can protect an underlying anodic oxide layer from abrasion, thereby preserving any colorant infused within the underlying anodic oxide layer. In this way, the multilayer oxide coatings can enhance and preserve a cosmetic quality to consumer products 102, 104, 106 and 108.

Figure 2C:
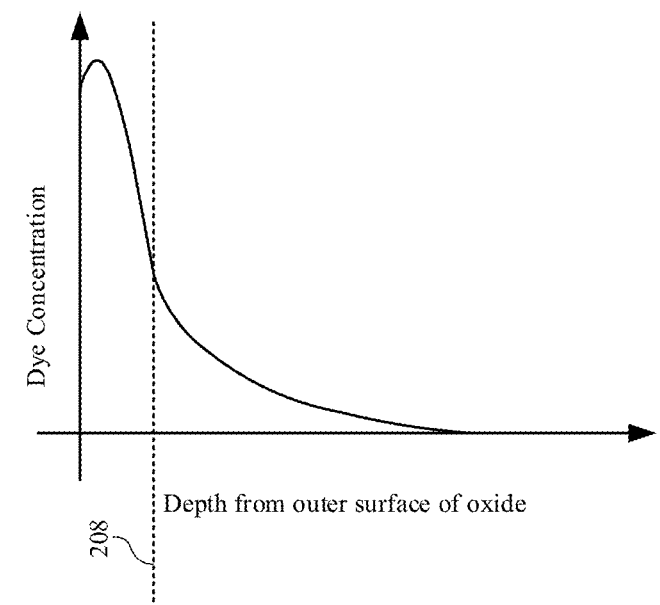
FIGS. 2A-2C show pore structure and dye distribution within an anodic oxide coating.
Figure 2B:
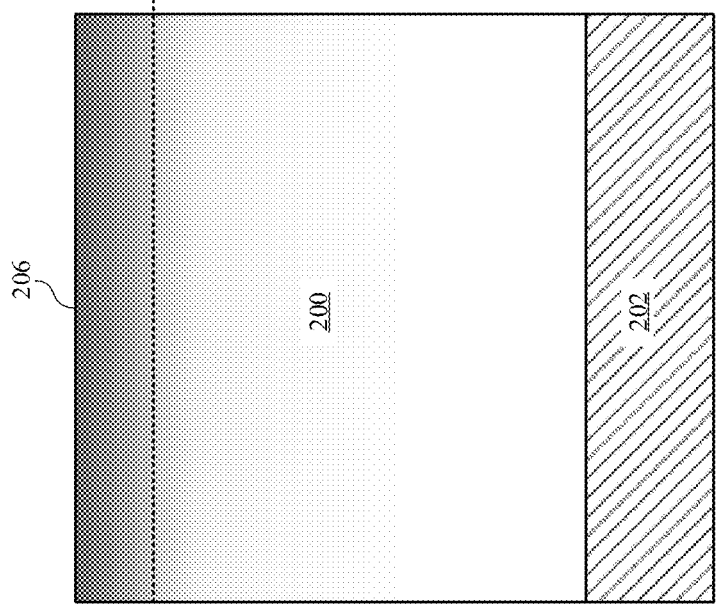
Figure 2A:
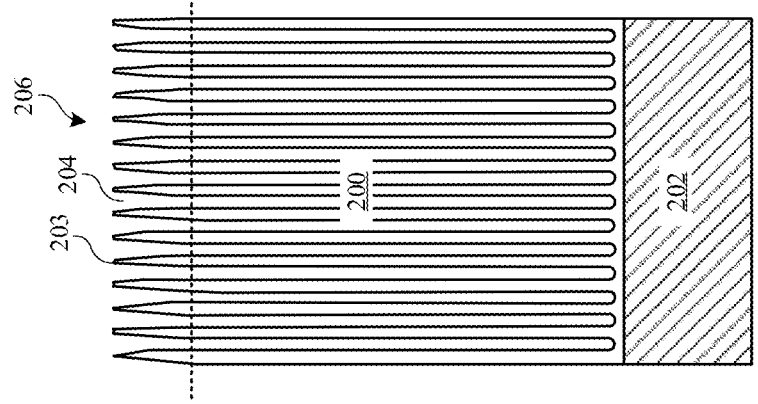

FIGS. 2A-2C show a pore structure and dye distribution within a single layer anodic oxide coating. FIG. 2A illustrates a cross-section view of anodic oxide coating 200, which is formed by converting surface portions of metal substrate 202 using an anodizing process to a corresponding metal oxide. Anodic oxide coating 200 includes multiple pores 204, which are formed during the anodizing process. The diameters of pores 204 can vary depending on conditions of the anodizing process. For example, a "Type II anodizing" (as defined by Mil-A-8625) process, which involves anodizing in a sulfuric acid electrolyte, can result in pores 204 having diameters ranging from about 10 nm to about 50 nm. As shown, the ends of pores 204 near outer surface 206 can be rough. This roughened outer surface 206 may occur as a consequence of the anodizing process, which involves some dissolution of the oxide material, or may be purposely formed using a chemical etching process in order to increase dye uptake.

FIG. 2B shows a different cross-section view of anodic oxide coating 200 after being colored. Note that pores 204 are not shown in FIG. 2B for simplicity although pores 204 are present. The coloring process can include infusing a colorant, such as a dye, within anodic oxide coating 200. For example, anodic oxide coating 200 can be immersed in a solution containing the dye, which then diffuses within pores 204 and becomes adsorbed onto surfaces of pore walls 203. In this way, the dye can impart a corresponding color to anodic oxide coating 200.

FIG. 2B shows that the concentration of adsorbed dye may not be uniform throughout the oxide thickness. In particular, the majority of the dye can be concentrated predominantly within outer portion (demarcated by line 208), which in some cases corresponds to the outermost two to three micrometers of anodic oxide coating 200. This is illustrated graphically at FIG. 2C, which shows the dye concentration within anodic oxide coating 200 as a function of depth from outer surface 206. This uneven dye distribution may be attributed to the dye diffusion process and/or may be attributed to the relatively larger porous area of roughened outer surface 206. That is, outer portion 208 can have a reduced density of oxide material, corresponding to more pore wall surface area for the dye to adsorb onto.

In some cases, it may be desirable to finish outer surface 206 using, for example, a buffing, polishing or lapping process. This can provide a cosmetically appealing glossy appearance to outer surface 206 and to anodic oxide coating 200. However, the uneven dye distribution within anodic oxide coating 200 can pose a problem in these situations. In particular, since the finishing process is a progressive removal process, outer portion 208, which typically contains a majority of the dye, may be reduced or removed, thereby diminishing the color of the anodic oxide coating 200. In addition, since the majority of dye resides within such a small thickness of anodic oxide coating 200, extremely tightly controlled and uniform material removal may be required to avoid obvious variations in color across outer surface 206.

Processes described herein can overcome these dye-related limitations by generating an additional supplementary oxide layer over anodic oxide coating 200, which can be finished to a desired surface quality while preserving the color imparted to anodic oxide coating 200.

FIGS. 3A-3E show cross-section views of metal substrate 302 undergoing a process for forming a multilayer oxide coating in accordance with some embodiments. Metal substrate 302 can correspond to an enclosure, or a portion of an enclosure, of an electronic device, such as portable phone 102, tablet computer 104, smart watch 106 or portable computer 108 described above. Metal substrate 302 can include any suitable material. In some cases, metal substrate 302 is composed of an anodizable metal including but not limited to one or more of aluminum, titanium, magnesium, niobium, zirconium, hafnium and tantalum. In some embodiments, metal substrate 302 is an alloy that contains alloying agents, such as one or more of zinc, silicon, iron, copper, manganese, magnesium, chromium, vanadium, titanium, and zirconium. In some embodiments metal substrate 302 is composed of a suitable aluminum alloy, such as suitable 6000 or 7000 series alloy. In some cases the aluminum alloy is a high strength aluminum alloy with relatively high amounts of zinc and magnesium as alloying elements.

Figure 3A:
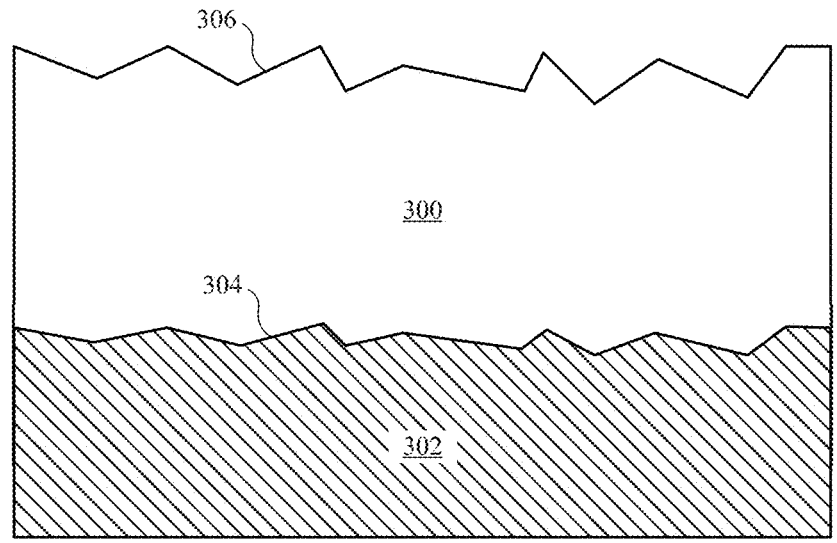
FIGS. 3A-3E show cross-section views of a metal substrate undergoing a multilayer oxide coating treatment.

FIG. 3A shows metal substrate 302 after an anodizing process, whereby a portion of metal substrate 302 is converted to a corresponding primary oxide layer 300. For example, an aluminum alloy metal substrate 302 can result in an aluminum oxide layer 300. Since primary oxide layer 300 can be formed using an anodizing process, primary oxide layer 300 can be referred to as an anodic oxide layer, or anodic oxide film. In general, the anodizing process can form pores within primary oxide layer 300, although not show in FIGS. 3A-3E.

Any suitable anodizing process can be used. In some embodiments, a Type II anodizing process, which involves anodizing in a sulfuric acid electrolyte, is used. Anodizing within process parameters of a Type II anodizing process can offer an attractive and versatile surface finish for aluminum and aluminum alloy parts. For example, oxide films formed by anodizing in sulfuric acid can be clear, and colorless, giving a bright, silver metallic finish that looks like bare metal, with much improved wear and corrosion resistance due to the thick, and relatively hard protective layer of oxide film that is formed on the substrate. The size and shape of the pores within primary oxide layer 300 can vary depending on the anodizing process. For example, Type II anodizing process can form pores having diameters ranging from about 10 nm to about 50 nm. Since anodizing is a conversion process, surface 306 of primary oxide layer 300 generally faithfully follows the contours of surface 304 of metal substrate 302, which can also be referred to as an interface surface 304 between metal substrate 302 and primary oxide layer 300. Thus, a textured interface surface 304 (e.g., by abrasive blasting and/or chemical etching of metal substrate 302 prior to anodizing) will generally result in a corresponding textured surface 306 of primary oxide layer 300. The thickness of primary oxide layer 300 can vary depending on design requirements. In some applications, the thickness of primary oxide layer 300 ranges from about 5 to about 50 micrometers.

In some applications, anodizing process parameters include using a current density range of about 1 to 2 A/dm$^2$, a sulfuric acid electrolyte at a concentration of about 200 g/l, and an electrolyte temperature of about 20° C., with film growth to a thickness of about 10 micrometers or more, resulting in primary oxide layer 300 having a hardness of at least about 300 HV$_{0.05}$, as measured using Vickers hardness test. In some cases, higher temperatures (e.g., 23° C. or higher, sometimes 27° C. or higher), and/or lower current densities (e.g., less than about 1.5 A/dm$^2$, sometimes 0.5 A/dm$^2$ or lower), and/or higher acid concentrations may be used to yield primary oxide layer 300 having less than a surface hardness of 300 HV$_{0.05}$. This would typically offer improved cosmetics to the primary oxide, such as higher optical clarity, less intrinsic discoloration, and higher gloss. This relatively softer primary oxide layer 300 may be sufficient in some cases since an additional oxide layer is to be deposited on primary oxide layer 300. These process parameters can promote the dissolution of the surface 306 of primary oxide layer 300, to the detriment of surface hardness, but with the benefit of improved wettability during subsequent immersion in an alkaline silicate, and an augmented roughness and surface area for improved adhesion of a secondary layer.

Figure 3B:
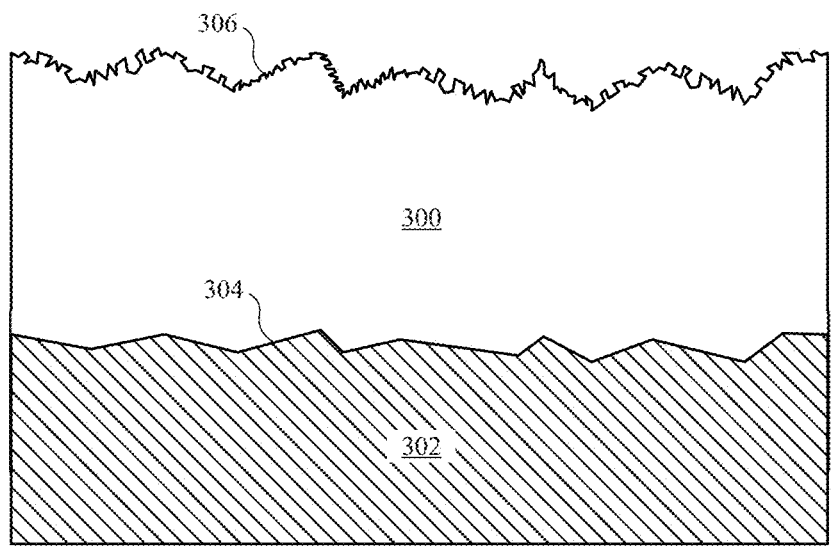

FIG. 3B shows metal substrate 302 after an optional surface treatment has been performed so as to roughen surface 306 of primary oxide layer 300. This optional treatment can be used to promote adhesion of a subsequently deposited secondary layer. In some cases, a surface treatment may be required to provide sufficient adhesion of the secondary layer to the primary oxide layer 300 in order to allow subsequent polishing or lapping (operations which can generate high mechanical stresses in the multilayer oxide coating, and particularly high shear stresses).

In some embodiments, the surface roughening process involves exposing primary oxide layer 300 to an etching solution, such as a dilute acid or alkali solution. Examples of suitable etching solutions can include solutions containing nitric acid, phosphoric acid, sulfuric acid, sodium carbonate or sodium hydroxide. In some cases, primary oxide layer 300 is immersed in dilute nitric acid (e.g., at about 10 to about 15 weight %) at room temperature for between 30 seconds and 10 minutes, as this chemistry can help remove contamination on primary oxide layer 300 that could otherwise inhibit or interfere with dye uptake. Thus, the chosen etching process can depend on the subsequent dye coloring system.

Instead of, or in addition to, a chemical etching process, the type of metal substrate 302, the surface texture of metal substrate 302 prior to anodizing, and the type of anodizing process can also contribute to the roughness of surface 306 of primary oxide layer 300, and may be tailored to optimize adhesion of the secondary layer. For example, as described above, parameters that would not normally be suitable for producing a sufficiently hard and cosmetically suitable oxide layer can be considered in this process since surface 306 is not destined to be the ultimate outer surface of the coating. For instance, lower current densities and/or higher operating temperatures for the anodizing bath, as described above, may be used. Regarding the type of metal substrate 302, aluminum alloys with higher levels of zinc (e.g., about 6 weight % or greater) and/or magnesium (e.g., about 1.5 weight % or greater) may be considered, which are not anodized to sufficient hardness values using conventional anodizing processes. Metal surfaces with very fine scale roughness, such as those resulting from laser ablation, can be considered. These might normally result in the growth of a primary anodic film too defective for adequate corrosion protection of an aluminum substrate, but in this process, the resulting surface roughness, porosity and anodizing defects may be beneficial for the adhesion of the secondary oxide, while the secondary oxide can provide a barrier and adequate corrosion protection.

The surface treatment can reduce the surface hardness of primary oxide layer 300. However, this hardness deficiency can be at least partially overcome when a secondary layer is deposited over primary oxide layer 300. For example, even when the surface hardness of the primary oxide layer 300 is reduced to below 200 HV$_{0.05}$, either by etching primary oxide layer 300, or by using an anodizing process (FIG. 3A) optimized for higher surface etching and porosity, surface hardness of 300 HV$_{0.05}$ or more in the final product can be recovered since porosity of primary oxide layer 300 can be filled with material of at least 400 HV$_{0.05}$ hardness, such as silica, zirconia or alumina.

Figure 3C:
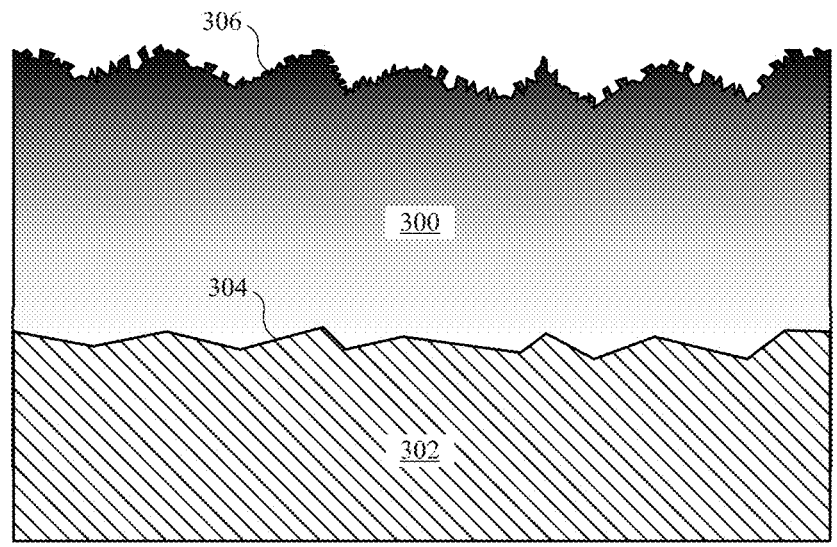

FIG. 3C shows primary oxide layer 300 after a coloring process has been performed. As described above with reference to FIGS. 2A-2C, some colorants, such as some organic dyes, can be unevenly distributed within the thickness of primary oxide layer 300. In particular, in some cases most of the colorant is concentrated near surface 306. Despite being colored, in some cases primary oxide layer 300 is at least partially transparent to visible light such that metal substrate 302 is visible through primary oxide layer 300. In other cases, primary oxide layer 300 is colored to a degree that metal substrate 302 is not substantially visible through primary oxide layer 300.

Coloring of primary oxide layer 300 may be achieved in any of a number of suitable ways, including choosing certain alloys for metal substrate 302 having particular color-inducing alloying elements, anodizing in electrolytes that include organic acids, and/or depositing of metal or other fine-scale pigments within the pore structure of primary oxide layer 300. One flexible and useful coloring process is dyeing with organic dyes. Dyeing processes can exploit the fine-scale pore structure of a Type II anodic oxide, which presents a very high surface area of amorphous oxide material, and which can be conducive to adsorbing many types of organic or inorganic molecules or ions at controlled rates to sufficiently high concentrations for intense colors to be achieved. In this way, a very wide range of colors and shades can be achieved and precisely controlled by simply adjusting dye composition (especially by mixing various differently colored dyes), and by adjusting readily varied process parameters such as immersion time of primary oxide layer 300 within a dye solution. In some embodiments, a desired final color is black or grey, while in other embodiments, more varied colors such as blue, red, green, yellow, violet, and mixtures thereof are desired.

Note that the coloring of primary oxide layer 300 may be performed prior to the optional surface roughening at FIG. 3B. However, this process sequence may not be beneficial in cases where the surface roughening process can interfere with a precisely controlled coloring process.

Figure 3D:
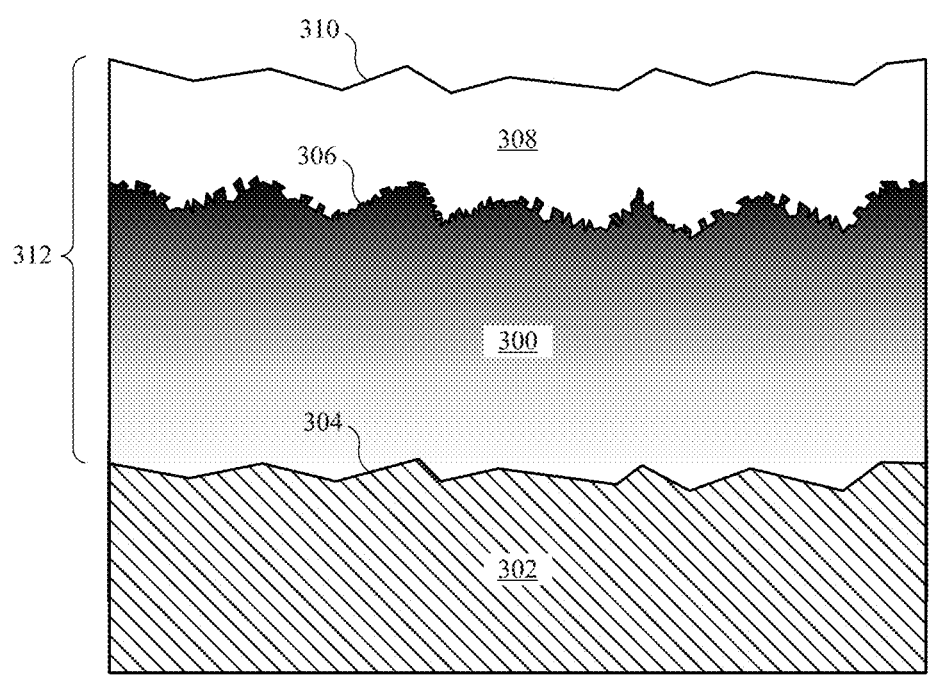

FIG. 3D shows secondary layer 308 deposited on primary oxide layer 300. Secondary layer 308 includes surface 310, which replaces surface 306 of primary oxide layer 300 as the outermost surface of multilayer oxide coating 312. The nature of secondary layer 308 will depend on the type of material and the method of depositing secondary layer 308, as well as the thickness of secondary layer 308. Secondary layer 308 can be composed of any suitable material. In some applications it is desirable for secondary layer 308 to be composed of an oxide material, such as one or more of silicon oxide (e.g., silicon dioxide, silica), titanium oxide (e.g., titanium dioxide, titania), zirconium oxide (e.g., $ZrO_2$, zirconia) and aluminum oxide (e.g., $Al_2O_3$, alumina). This can provide a hard, scratch resistant coating that has a glass-like appearance. In addition, oxide materials can provide a cool-to-the touch feel that may not be achieved using materials such as polymer materials. However, in other applications, secondary layer 308 is composed of a non-oxide material. For example, secondary layer 308 can be composed of a polymer material, such as urethane, acrylic, epoxy, etc. Mixtures, such as polymers loaded with fine oxide particles, may also be used for secondary layer 308.

Any of a number of suitable deposition processes can be used to deposit secondary layer 308. It should be noted that an anodizing process cannot be used for forming secondary layer 308 since the anodizing process involves conversion of metal substrate 302. Therefore, an additional anodizing process grows additional oxide at interface 304 between metal substrate 302 and primary oxide layer 300. Furthermore, an additional anodizing process may interfere with the established dye color, for example by leaching out of the dye.

In some embodiments, the deposition process results in secondary layer 308 having a substantially non-porous (i.e. no anodic pores) oxide layer. In some applications, secondary layer 308 should be hard and/or scratch resistant, and sufficiently transparent to visible light such that primary oxide layer 300 is viewable through secondary layer 308. In addition, in applications where surface 310 of secondary layer 308 is to be mechanically finished, secondary layer 308 should be well adhered to primary oxide layer 300. As described above, this can allow a wide process window for mechanical finishing processes in order to achieve a desired high-gloss finish. If secondary layer 308 is composed of a non-oxide material, such as a plastic material, deposition techniques such as one or more molding, pressing, spray on, spin on and dipping methods can be used.

The deposition process can be such that secondary layer 308 is directly bonded to primary oxide layer 300—that is, without the use of an intermediate adhesive layer between primary oxide layer 300 and secondary layer 308. If surface 306 of primary oxide layer 300 is rough, this can provide more surface area for secondary layer 308 to bond with primary oxide layer 300. That is portions of secondary layer 308 can become deposited within spaces of the roughed surface 306, thereby creating mechanical keying and a stronger bond between secondary layer 308 and primary oxide layer 300. In some cases, portions of secondary layer 308 can be partially deposited within pores of primary oxide layer 300.

In applications where secondary layer 308 includes a silicon oxide, the deposition process can include the deposition of silicates from aqueous alkaline silicate solutions, such as solutions having sodium silicate. In some cases the solution includes additives, such as zinc oxide, to catalyze solidification of silicates. Such silicate depositing processes generally involve a thermal cure process to remove water and form secondary layer 308 with a hard and glassy surface 310. Alternatively, or in addition to a thermal cure, low pressure or a vacuum may be applied to dehydrate a deposited solution, suspension or gel. The silicates may be applied using any of a number of suitable processes, including rolling on, screen-printing and spin coating. Spraying on and immersion followed by draining may be used if the surface geometry of metal substrate 302 is non-flat, such as having angled, curved, spline shaped or complex surface geometry. Examples of silicate solutions suitable for application by immersion include the Star® and E® products from PQ Corporation (a U.S. company based in Malvern, Pa.), which have respective densities of 42 and 40° Be or 1.41 and 1.38 g/cm3 at 20° C., and are substantially transparent, colorless, and stable solutions. The solutions can be applied, dried and thermally cured. In the embodiment of a silicate oxide film applied by immersion of primary oxide layer 300 into an aqueous silicate solution, secondary layer 308 may itself smooth surface 306 of primary oxide layer 300 somewhat since doing so may minimize the surface energy of surface 306 whilst in a fluid state. This may somewhat reduce the degree of material removal necessary to obtain a smooth, glass-like surface appearance but some degree of polishing may still be necessary to achieve a desired cosmetic appearance.

The thickness of secondary layer 308 can be partly controlled by exposure time, but may be primarily controlled by the solution's specific gravity or viscosity—with higher viscosity solutions generally resulting in a thicker secondary layer 308. In some embodiments the thickness of secondary layer 308 is about 2 micrometers or greater—in some cases ranges from about 2 micrometers to about 3 micrometers.

A further consideration when depositing secondary layer 308 relates to a thermal curing process, such as thermal treatments of an aqueous silicate to drive off water and cure the resulting glass. For example, exposure of certain heat-sensitive alloy tempers (such as a peak-aged 7000-series alloy) about particular temperatures can cause differential thermal expansion of metal substrate 302 and primary oxide layer 300, which can result in cracking of primary oxide layer 300. Similar thermal expansion cracking problems may occur in non-metal portions of a part adjacent to metal substrate 302. For example, plastic portions (e.g., radio-frequency transparent antenna windows) of the enclosures for portable phone 102, tablet computer 104, smart watch 106 and portable computer 108 described above may be susceptible to cracking or thermal fatigue. Furthermore, exposure to certain temperatures may limit the range of types of dye colors, since many organic dyes have critical temperatures above which they degrade and permanently change color—often in the range of about 150-250° C. However, in some cases proper drying and curing of silicon oxide from aqueous silica films should be at least about 150° C.—in some cases, at least about 200° C. Curing exposure time can depend on the temperature, as well as the silicate composition and thickness. In some cases, low temperature evaporation (e.g., by reduced pressure) may be preferable to minimize damage to primary oxide layer 300 and the effects of differential thermal expansion between substrate 302 and primary oxide layer 300 and/or between primary oxide layer 300 and secondary layer 308.

Alternative processes that may be used to apply secondary layer 308 can include physical vapor deposition (PVD) processes. Alumina, silica, zirconia, titania or mixes thereof can be applied using physical vapor deposition, and can provide opportunities for hard, substantially transparent secondary layer 308 with good uniformity and sufficient adhesion, especially where a prior roughening or etch of surface 306 has been conducted. These can be applied without the need for subsequent cure, and can potentially even achieve superior hardnesses to those of a cured silicate.

Figure 3E:
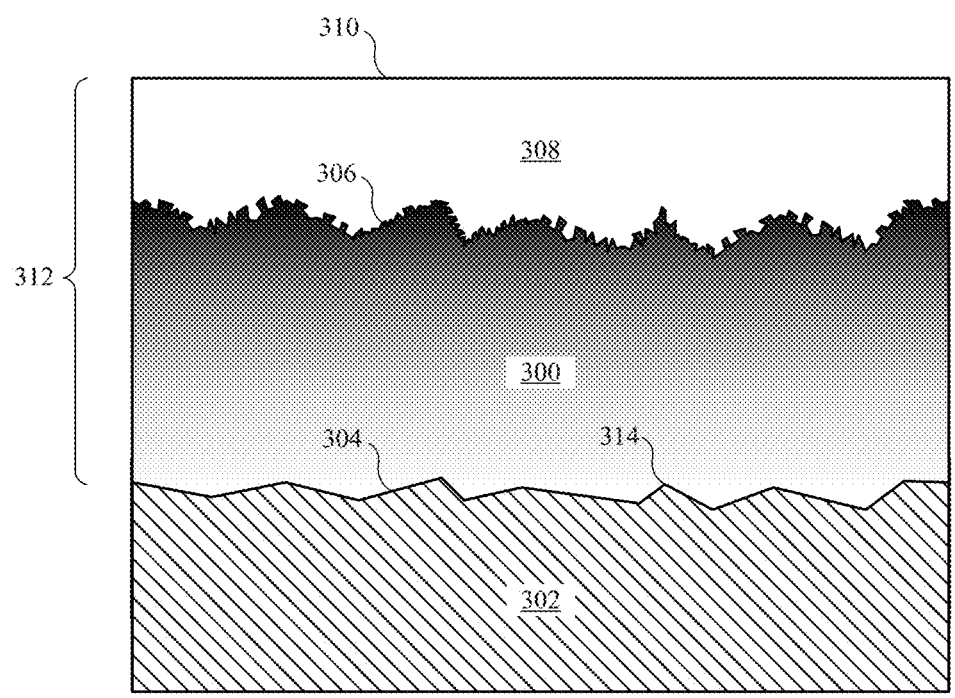

FIG. 3E shows secondary layer 308 after surface 310 is optionally finished smooth. As described above, any suitable finishing process can be used, such as one or more lapping, polishing or buffing processes. In some embodiments, surface 310 is finished to a surface roughness of about 100 nm $R_a$ or less. Thus, surface 310 can provide an overlying specularly reflective, glossy and shiny appearance to metal substrate 302. If metal substrate 302 has a textured surface 304, such as a chemically etched and/or abrasively blasted texture, surface 304 can provide an underlying diffusely reflective, matte appearance. In some cases, peaks 314 on surface 304 can act as local points of reflection, causing surface 304 to have a sparkling or glittering appearance. In this way, specularly reflective surface 310 of secondary layer 308 combined with diffusely reflective surface 304 of metal substrate 302 can result in an unusual combination of both a glassy and sparkling or matte appearance to a part. In addition, secondary layer provides a very hard and scratch resistant surface—in some cases having a Vickers hardness value of at least 400 $HV_{0.05}$—in some cases, over 500 $HV_{0.05}$.

Note that since secondary layer 308 is polished, this protects primary oxide layer 300 from the erosion effects of the polishing process. Thus, even though the distribution of dye can be non-uniform throughout the thickness of primary oxide layer 300, with a majority of dye within outer portions of primary oxide layer 300 closest to surface 306, the presence of secondary layer 308 will assure that the outer portions of primary oxide layer 300 close to surface 306 will stay intact. In this way, the color of multilayer oxide coating 312 can stay intact and uniform across the lateral length of metal substrate 302.

Figure 4:
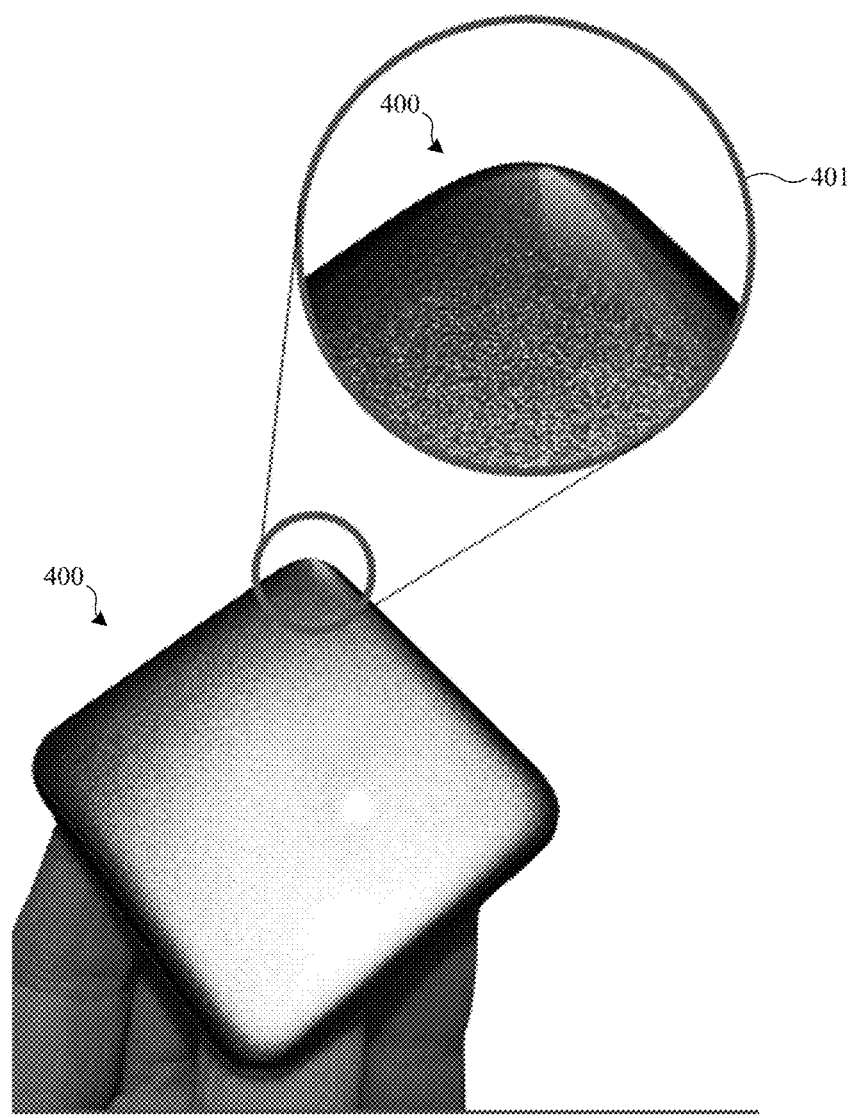
FIG. 4 shows a perspective view of a part having a multilayer oxide coating.

FIG. 4 shows a perspective view of part 400 having a multilayer oxide coating in accordance with some embodiments. Inset 401 shows a close up view of a corner portion of part 400. The multilayer oxide layer on part 400 includes a textured metal substrate surface, a dyed primary oxide layer, and a polished outer secondary layer. The textured metal substrate surface can provide a sparkling or glittering effect, the dyed primary oxide layer can provide a desired color hue, and the smooth secondary layer surface can provide an outer high gloss finish with specular reflections. These combined effects can give part 400 a glass-like appearance with a perception of depth. The secondary layer provides a hard, abrasion resistant and cool-to-the-touch feel to part 400, which can make the multilayer oxide coating a desirable finish for consumer electronics. This unusual clear-coated type finish may be achieved without a thick and thermally insulating polymer or lacquer, which can feel very softer and warmer than a relatively harder and cool-to-the-touch oxide film. Furthermore, since the primary oxide layer is not polished, the color provided by the primary oxide layer is consistent, even across curved surfaces (corners and edges) of part 400, and conventional methods used for color control of dyed anodized parts (such as dye composition, concentration, temperature and immersion time) may be used to precisely control color.

Figure 5C:
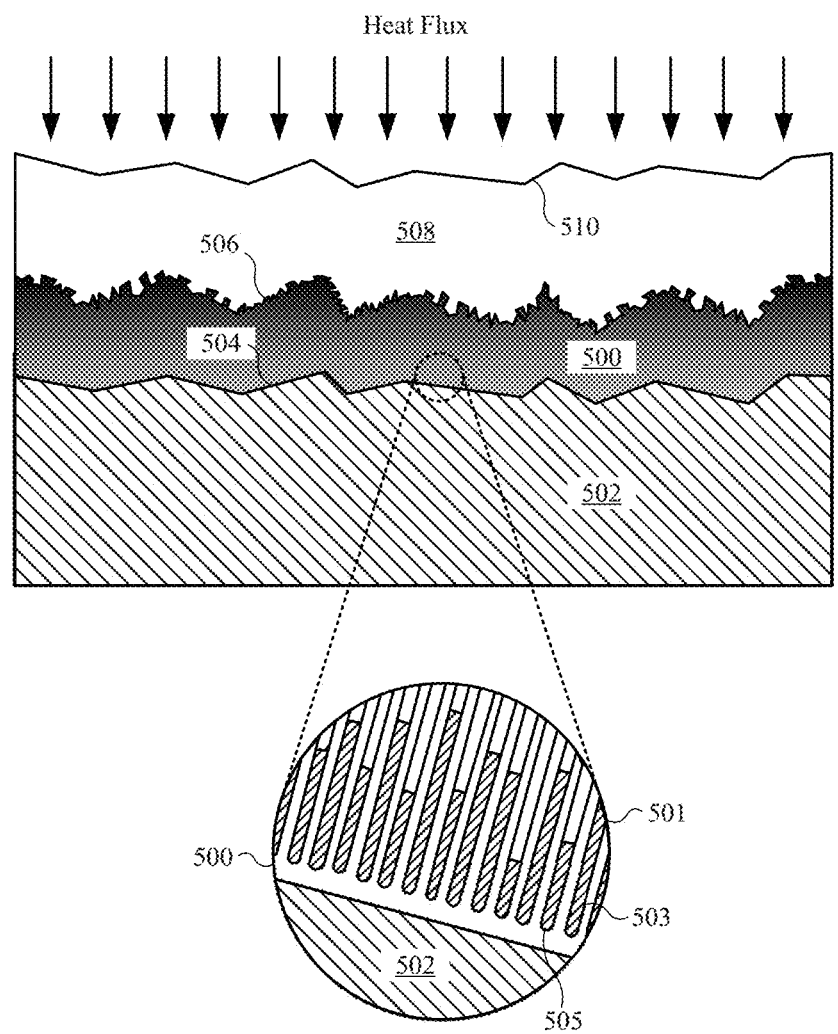

FIGS. 5A-5C show alternative structures of a multilayer oxide coating to protect integrity of a dye during a thermal curing of a secondary layer. FIG. 5A shows a cross-section view of metal substrate 502, having primary oxide layer 500 and secondary layer 508 (multilayer oxide coating) deposited thereon. Metal substrate 502 is composed of an aluminum alloy, primary oxide layer 500 is a Type II anodized film dyed with an organic-based dye, and secondary layer 508 is composed of a silicon oxide. As shown, a significant portion of the dye within primary oxide layer 500 resides near interface 506 between primary oxide layer 500 and secondary layer 508.

Secondary layer 508 can be exposed to heat flux, such as from an ultraviolet light source, during a thermal curing process. FIG. 5B shows a graph indicating temperatures of secondary layer 508, primary oxide layer 500 and metal substrate 502 as a function of depth from outer surface 510 during the thermal curing process. The graph of FIG. 5B indicates that when secondary layer 508 reaches temperatures of at least 200° C. for adequate curing, there is poor heat conduction across interface 506 between primary oxide layer 500 and secondary layer 508. In particular, primary oxide layer 500 can maintain temperatures of 100° C. or less. Metal substrate 502 can remain relatively cool and can act as a heat sink during the curing operation. Thus, much of the heat is retained within secondary layer 508, including near interface 506 where a significant portion of the dye within primary oxide layer 500 resides. In some cases, this can cause the dye near interface 506 to reach temperatures sufficient to at least partially degrade the color of the dye.

One way to address this issue is to increase the thickness of secondary layer 508 such that interface 506 is farther away from outer surface 510, thereby proportionally lessening heating of regions near interface 506. Additionally, the thickness of primary oxide layer 500 can be decreased, thereby decreasing the distance between interface 506 and metal substrate 502, which can act as a heat sink and draw some of the heat away from interface 506. In some cases, this results in secondary layer 508 being thicker than primary oxide layer 500, as shown in FIG. 5A.

FIG. 5C shows another embodiment where, in addition to adjusting thicknesses of primary oxide layer 500 and secondary layer 508, metal 503 is deposited within primary oxide layer 500. This is illustrated by inset 501 showing a close-up view of interface 504 between metal substrate 502 and primary oxide layer 500. As shown, metal 503 can be infused within terminuses of pores 505 of primary oxide layer 500 using, for example, an electrodeposition process. In practice, this typically means depositing metal 503 within primary oxide layer 500 via electrodeposition prior to depositing the dye. Like the dye, metal 503 can also provide a color to primary oxide layer 500—typically adding a darker hue. Some methods of electrodepositing metal within an oxide material are described in U.S. patent application Ser. No. 14/971,829, filed on Dec. 16, 2015, which is incorporated herein in its entirety for all purposes.

The introduction of metal 503 can augment the thermal conductivity of primary oxide layer 500 such that when exposed to heat, metal 503 deposited within pores 505 can act as heat conductive filaments that draw heat away from interface 506 and toward metal substrate 502. In this way, metal 503 can reduce the temperature to which the dye is exposed under a given heat flux. Metal 503 can include any suitable metallic material. In some embodiments, copper and/or silver were found to be especially useful in this regard due to their relatively high thermal conductivities (i.e., about 400 and about 435 W/mK, respectively) as compared to an anodic oxide, which has a thermal conductivity of less than 1 W/mK. This can greatly augment the thermal conductivity of primary oxide layer 500 relative to secondary layer 508, and thus greatly reduce the temperature to which primary oxide layer 500, and the dye contained within it, is exposed during an given cure cycle of the relatively hot secondary layer 508.

Increasing the roughness of interface 506 between primary oxide layer 500 and secondary layer 508 can further enhance the thermal conduction across the thickness of the multilayer coating. In particular, creating a finely etched surface to primary oxide layer 500 prior to depositing secondary layer 508 can potentially giving rise to fine-scale discontinuities at interface 506, resulting in interfacial thermal resistance across which a significant interfacial temperature difference may be sustained.

To exploit the augmented thermal conductivity of primary oxide layer 500 by metal 503, heating should be such that a temperature gradient is established and maintained across the multilayer oxide coating thickness. This may be achieved for example, using infrared (IR) lamps to irradiate outer surface 510 and/or applying cooling (such as water-cooled copper heat sinks) under metal substrate 502 to keep it cold and enhance its heat sink capability.

It should be noted that metal electrodeposition in pores 505 may not always be suitable in some applications. For example, metal 503 can limit the possible color range of the coating to darker shades, and can greatly reduce the brightness of reflection from surface 504 of metal substrate 502. In these cases, it may be preferable to minimize the primary oxide layer thickness relative to the secondary oxide, as described above with reference to FIGS. 5A and 5B, without depositing metal 503.

The amount of metal 503 deposited within pores 505, as measured by height of metal 503 within pores 505, can vary depending on particular design requirements. It is notable that practical limits in metal height, which might normally apply to electrodeposition of a metal into an anodic oxide, may not require consideration in the present work to the same degree. Typically, as a metal such as tin or copper is electrodeposited into an anodic oxide's pore structure, the height distribution is very non-uniform from pore to pore and the average metal deposit height must be restricted to only about 25% of the oxide thickness—sometimes about 10% of the oxide thickness—in order to avoid too many metal filaments breaching the outer surface of an anodic film, since doing so can inhibiting surface sealing and provide a pathway for corrosion of the underlying metal substrate. In embodiments presented herein, however, the secondary layer serves as a corrosion barrier, so that the primary oxide layer may be almost completely filled with metal.

Figure 6:
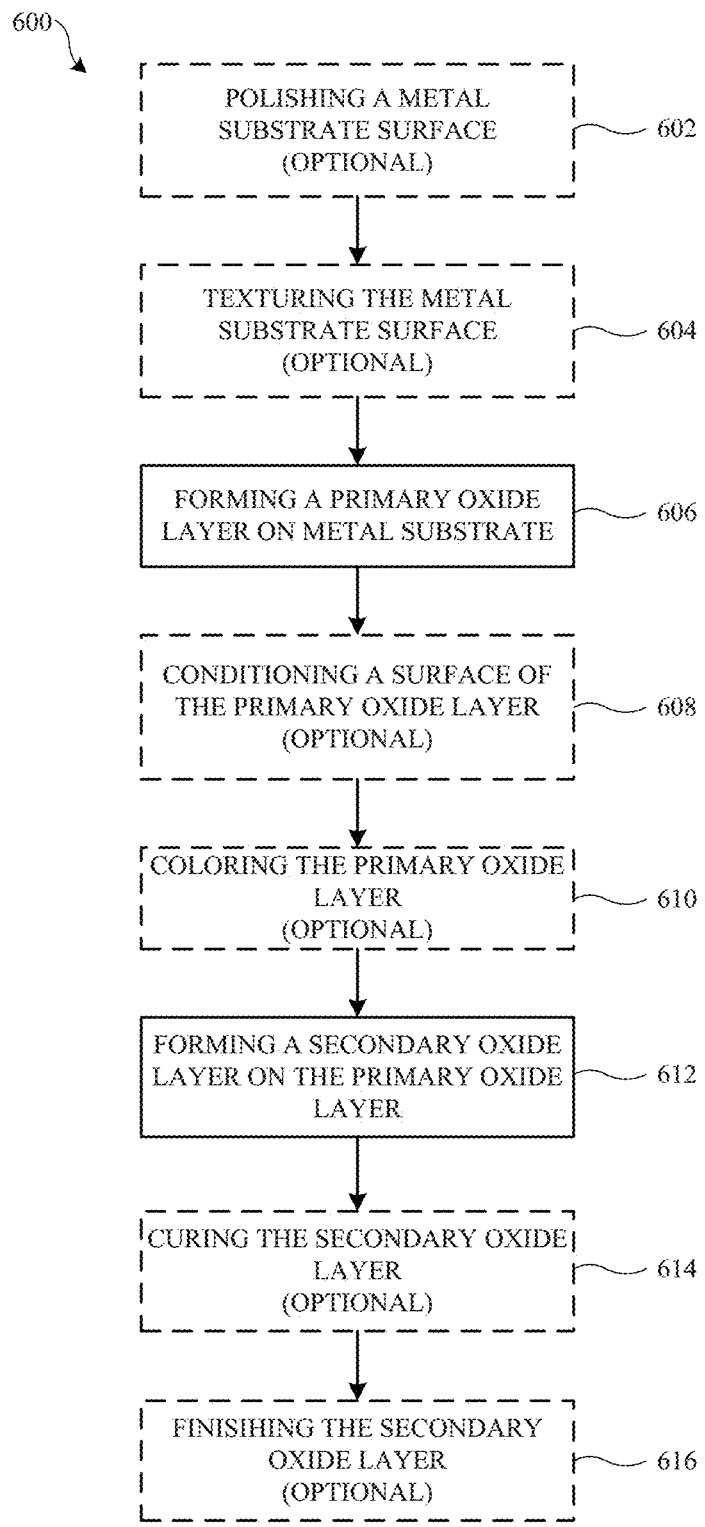
FIG. 6 shows a flowchart indicating a process for forming a multilayer oxide coating.

FIG. 6 shows flowchart 600, which indicates a process for forming a multilayer oxide coating in accordance with some embodiments. At 602, a surface of a metal substrate is optionally polished in order to create a uniformly even surface. In some cases, the surface of the metal substrate is substantially flat, such as a substantially planar surface of an enclosure. In other cases, the surface of the substrate is curved, such as curved edges or corners of an enclosure. The uniformly even surface can provide a basis for providing an even textured topology using a subsequent texturing process. At 604, the surface of the metal substrate is optionally textured using, for example, one or more abrasive blasting or chemical etching processes. The texturing process can create a matte texture having peaks that provide points of specular reflection, creating a glittery effect.

At 606, a primary oxide layer is formed on the metal substrate. The primary oxide layer can be a porous anodic oxide formed using an anodizing process. In some embodiments, a sulfuric acid-based anodizing process is used. In some cases, the anodizing conditions are chosen so as to create a primary oxide layer that is softer than a conventional anodic oxide. For example, a lower current density and/or higher electrolytic bath temperature can result in a soft and more porous primary oxide layer, which can be conducive to promoting adhesion of a subsequently deposited secondary layer. The thickness of the primary oxide layer can vary depending on a number of factors. In some embodiments, the thickness of the primary oxide layer ranges from about 5 to about 40 micrometers. In some embodiments, the primary oxide layer is grown to a thickness of about 10 micrometers or more.

At 608, an exposed surface of the primary oxide layer is optionally conditioned in order to enhance adhesion of a subsequently deposited secondary layer. The conditioning operation can include a chemical etching process that makes surface regions of the primary oxide layer more porous, thereby providing more surface area for a subsequently deposited secondary layer to bond with. At 610, the primary oxide layer is optionally colored using a coloring operation. The coloring process can include infusing a colorant, such as a dye, metal and/or other pigment within pores of the primary oxide layer. It should be noted that in some embodiments, it is desirable for the primary oxide layer to substantially colorless. In these cases, a colorant is not infused within primary oxide layer. After coloring, pores of the primary oxide are optionally sealed using a pore-sealing process prior to depositing a secondary layer.

At 612, a secondary layer is deposited on the primary oxide layer. In some embodiments, the secondary layer is a silicon oxide, titanium oxide, zirconium oxide, aluminum oxide, or a suitable combination thereof. The secondary layer can be deposited using spray on, solution immersion, rolling on, screen-printing, spin coating, physical vapor deposition, or any suitable combination thereof.

At 614, the secondary layer is optionally cured in order to dry and harden the secondary layer. In some cases a thermal curing process is used. In other cases, an evaporative process is used to dehydrate the secondary layer at lower temperatures. At 616, an outer surface of the secondary layer is optionally finished using, for example, a polishing, buffing or lapping process. The resultant secondary layer will have a glossy and specularly reflective outer surface. It should be noted that in some cases, the multilayer oxide coating includes more than two oxide layers. For example, one or more secondary layers may be subsequently deposited on the multilayer oxide coating in order to create unique visual effects, or for additional functionality such as oleophobicity.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An enclosure for an electronic device, the enclosure comprising:
an aluminum alloy substrate defining a textured external surface having a roughness;
a multilayer oxide coating having a combined hardness of at least 300 $HV_{0.05}$ or greater, the multilayer oxide coating comprising:
a first metal oxide layer overlaying the aluminum alloy substrate, the first metal oxide layer having:
a thickness of about 5 to about 50 μm;
pores including a colorant infused therein and metal deposited therein, the metal comprising copper or silver;
a textured surface having a roughness greater than the roughness of the textured external surface of the substrate; and
an outer portion exhibiting a reduced density and comprising a majority concentration of the colorant, and
a second metal oxide layer overlaying the textured surface, the second metal oxide layer having:
a thickness greater than the thickness of the first metal oxide layer;
wherein the outer portion of the first metal oxide layer is the outermost 2-3 μm of the thickness of the first metal oxide layer which is adjacent the overlying second metal oxide layer, inclusive of the textured surface,
wherein the metal deposited in the pores fills greater than 25% of the internal volume of the pores, and
wherein the second metal oxide layer comprises a metal oxide different than that of the first metal oxide layer.

2. The enclosure of claim 1, wherein the textured surface of the first metal oxide layer defines peaks capable of diffusely reflecting visible light incident thereupon.

3. The enclosure of claim 1, wherein the first metal oxide layer has a hardness value that is less than 300 $HV_{0.05}$.

4. The enclosure of claim 3, wherein the second metal oxide layer has a hardness value that is at least 400 $HV_{0.05}$ or greater.

5. The enclosure of claim 1, wherein the first metal oxide layer has a hardness of less than 200 $HV_{0.05}$.

6. The enclosure of claim 1, wherein the second metal oxide layer comprises at least one of silicon oxide, titanium oxide, zirconium oxide, and aluminum oxide.

7. An enclosure for an electronic device, the enclosure comprising:
an aluminum alloy substrate defining a textured external surface having a roughness;
a multilayer oxide coating having a combined hardness of at least 300 $HV_{0.05}$ or greater, the multilayer oxide coating comprising:
a first metal oxide layer overlaying and formed from the aluminum alloy substrate, the first metal oxide layer having:
a thickness of about 5 to about 50 μm;
pores including a colorant infused therein and a metal deposited therein, the metal comprising copper or silver;
a hardness value of less than 300 $HV_{0.05}$;
a textured surface having a roughness greater than the roughness of the textured external surface of the substrate; and
an outer portion exhibiting a reduced density and comprising a majority concentration of the colorant, and
a second metal oxide layer overlaying the textured surface and extending into spaces defined by the textured surface to form a mechanical key between the first metal oxide layer and the second metal oxide layer, the second metal oxide layer having:
a thickness greater than the thickness of the first metal oxide layer; and
a hardness value of at least 400 $HV_{0.05}$ or greater,
wherein the outer portion of the first metal oxide layer is the outermost 2-3 μm of the thickness of the first metal oxide layer which is adjacent the overlying second metal oxide layer, inclusive of the textured surface, and
wherein the metal deposited in the pores fills greater than 25% of the internal volume of the pores.

8. The enclosure of claim 7, wherein an external surface of the second metal oxide layer has a surface roughness of about 100 nm $R_a$ or less.

9. The enclosure of claim 7, wherein the second metal oxide layer comprises at least one of silicon oxide, titanium oxide, zirconium oxide, and aluminum oxide.

* * * * *